(12) United States Patent
Chen et al.

(10) Patent No.: US 8,354,310 B2
(45) Date of Patent: Jan. 15, 2013

(54) SOI MOS DEVICE HAVING A SOURCE/BODY OHMIC CONTACT AND MANUFACTURING METHOD THEREOF

(75) Inventors: Jing Chen, Shanghai (CN); Qingqing Wu, Shanghai (CN); Jiexin Luo, Shanghai (CN); Xiaolu Huang, Shanghai (CN); Xi Wang, Shanghai (CN)

(73) Assignee: Shanghai Institute of Microsystem and Information Technology, Chinese Academy of Sciences, Changning District, Shanghai (CN)

( * ) Notice: Subject to any disclaimer, the term of this patent is extended or adjusted under 35 U.S.C. 154(b) by 84 days.

(21) Appl. No.: 13/131,126

(22) PCT Filed: Sep. 7, 2010

(86) PCT No.: PCT/CN2010/076683
§ 371 (c)(1),
(2), (4) Date: May 25, 2011

(87) PCT Pub. No.: WO2012/003659
PCT Pub. Date: Jan. 12, 2012

(65) Prior Publication Data
US 2012/0009741 A1    Jan. 12, 2012

(30) Foreign Application Priority Data
Jul. 6, 2010   (CN) .......................... 2010 1 0220390

(51) Int. Cl.
| H01L 21/00 | (2006.01) |
| H01L 21/84 | (2006.01) |
| H01L 21/336 | (2006.01) |
| H01L 21/8234 | (2006.01) |
| H01L 21/331 | (2006.01) |

(52) U.S. Cl. ........ 438/156; 438/149; 438/197; 438/311; 438/479

(58) Field of Classification Search .................. 438/156, 438/151, 584, 621, 581, 592, 369, 370, 372, 438/373, 378, 301, 302, 303, 304, 305, 306, 438/649, 651, 655, 664, 682, 721, 149, 479, 438/517, 311, 197, 332
See application file for complete search history.

(56) References Cited

U.S. PATENT DOCUMENTS

| 4,952,991 A * | 8/1990 | Kayama .................... 257/335 |
| 7,265,416 B2 * | 9/2007 | Choi et al. ................. 257/343 |
| 2002/0125534 A1 * | 9/2002 | Kim et al. .................. 257/347 |

* cited by examiner

FOREIGN PATENT DOCUMENTS
WO  PCT/CN2010/076683   4/2011

*Primary Examiner* — Chuong A. Luu
(74) *Attorney, Agent, or Firm* — Global IP Services; Tianhua Gu

(57) ABSTRACT

The present invention discloses a manufacturing method of SOI MOS device having a source/body ohmic contact. The manufacturing method comprises steps of: firstly creating a gate region, then performing high dose source and drain light doping to form the lightly doped N-type source region and lightly doped N-type drain region; forming an insulation spacer surrounding the gate region; performing large tilt heavily-doped P ion implantation in an inclined direction via a mask with an opening at the position of the N type Si source region and implanting P ions into the space between the N type Si source region and the N type drain region to form a heavily-doped P-type region; finally forming a metal layer on the N type Si source region, then allowing the reaction between the metal layer and the remained Si material underneath to form silicide by heat treatment. In the device prepared by the method of the present invention, an ohmic contact is formed between the silicide and the heavily-doped P-type region nearby in order to release the holes accumulated in body region of the SOI MOS device and eliminate floating body effects thereof. Besides, the device of the present invention also has following advantages, such as limited chip area, simplified fabricating process and great compatibility with traditional CMOS technology.

6 Claims, 3 Drawing Sheets

SOI MOS DEVICE HAVING A SOURCE/BODY OHMIC CONTACT AND MANUFACTURING METHOD THEREOF

CROSS REFERENCE TO RELATED PATENT APPLICATION

The present application is the US national stage of PCT/CN2010/076683 filed on Sept. 7, 2010, which claims the priority of the Chinese patent application No. 201010220390.5 filed on Jul. 6, 2010, which application is incorporated herein by reference.

FIELD OF THE INVENTION

The present invention relates to a manufacturing method of a MOS (Metal Oxide Semiconductor) structure, more particularly to a manufacturing method of SOI MOS device having a source/body ohmic contact via silicide process, which belongs to semiconductor manufacturing field.

BACKGROUND OF THE INVENTION

SOI means silicon on insulator. In SOI technique, devices usually are fabricated in a thin silicon film and a buried oxide layer (BOX) is disposed between the device and the ii substrate to separate them. Comparing to traditional bulk silicon, SOI technology has many advantages, such as reduced parasitic capacitance making SOI device provide higher speed and consume less power, full dielectric isolation of the SOI CMOS device eliminating the occurrence of bulk-Si CMOS device parasitic latch-up effects and making SOI technique have superior performances including high integration density, and good anti-irradiation properties. SOI technique has been widely applied in many technical fields such as radio-frequency, high voltage and anti-irradiation. With the size of the device continuing to shrink, SOI technique will be probably the first choice of Si technique instead of bulk silicon.

According to whether the active body region is depleted, SOI MOS can be classified into partially depleted SOI MOS (PDSOI) and fully depleted SOI MOS (FDSOI). Generally, the top silicon film of fully depleted SOI MOS is thinner leading to many disadvantages. In one hand, the thin silicon film has high cost, and in the other hand, the threshold voltage of the fully depleted SOI MOS is hard to control. Therefore, the partially depleted SOI MOS is general adopted currently.

The active body region of PDSOI is partially depleted which makes the body region appear in suspending state and the electric charge caused by impact ionization can't be removed rapidly, resulting in floating body effect which is the special characteristic of SOI MOS. For the electron-hole pairs produced via collision of the SOI MOS channel electrons, the holes will move to the body region. The floating body effect of SOI MOS will result in the accumulation of holes in the body region to raise the electric potential of the body region. Due to the body effect, the threshold voltage of SOI NMOS is reduced and the leakage current is increased resulting in the warping displacements of the output characteristic curve $I_d V_d$, known as the Kink effect Kink effect having negative effects on the performances and reliabilities of the device and the circuit should be eliminated. The Kink effects of SOI PMOS device is not so obvious because the electron-hole pairs produced via collision is much less than SOI NMOS due to the lower ionization rate of the holes.

In order to resolve the problem of partially depleted SOI MOS, the method of body contact is usually adopted to connect the "body" to the fixed electric potential such as the source region or the ground. Referring to FIG. 1a-1b, in the traditional T-type gate structure body-contact, the $P^+$ implantation region formed in one side of the T-type gate is connected to the P-type body region. During the operation of the MOS devices, the carriers accumulated in the body region release via flowing through the $P^+$ channel to reduce electric potential of the body region. However, there are still some disadvantages such as complex manufacturing process, increased parasitic effect, degraded electric properties and increased device area.

Therefore, in order to eliminating floating body effects, there is a need for a manufacturing process of MOS structure which could be realized via silicide technology and a simple manufacturing process compatible with conventional CMOS process.

SUMMARY OF THE INVENTION

Consistent with embodiments of the present invention, a manufacturing method of SOI MOS device having a source/body ohmic contact via silicide process is provided. The method comprises steps of:

(A) forming a shallow trench isolation structure on a buried insulation layer on Si substrate to isolate an active region and creating a gate region on the active region;

(B) forming a lightly doped N type source region with high dopant concentration and a lightly doped N type drain region with high dopant concentration via high dose source light doping process and drain light doping process respectively, wherein the dose of the source light doping process and drain light doping process could reach a volume level of $1e15/cm^2$, and the concentration of the lightly doped N type source region and the lightly doped N type drain region could reach a volume level of $1e19/cm^3$;

(C) forming an insulation spacer around the gate region, forming a N type Si source region and a N type drain region via source and drain ion implantation, a body region fromed between the N type Si source region and the N type drain region;

(D) performing large tilt heavily-doped P ion implantation in an inclined direction via a mask with an opening at the position of the N type Si source region and implanting P ions into the space between the N type Si source region and the N type drain region to form a heavily-doped P-type region; wherein the angle between a longitudinal line of the N type Si source region and the inclined direction is ranging from 15 to 45 degrees;

(E) forming a metal layer on the N type Si source region, then allowing the reaction between the metal layer and the remained Si material underneath to form silicide by heat treatment and proceeding the reaction until the silicide formed being contact with the buried insulation layer; the left Si material which has not been react with the metal layer becoming N-type Si region, and a N-type source region being formed by the silicide and the N-type Si region; the heavily-doped P-type region being contact with the buried insulation layer, the body region, the N-type Si region of the N-type source region and the silicide respectively, and an ohmic contact formed between the heavily-doped P-type region and the silicide.

Preferably, in step A, P ion implantation in the active region is performed before creating the gate region.

Preferably, in step D, the angle is 35 degrees.

Preferably, in step E, the metal layer is formed of the metal selected from Co or Ti; and in the said heat treatment reaction, furnace annealing procedure is adopted, the temperature of heat treatment is ranging from 700° C. to 900° C. and the time of the heat treatment is ranging from 60 seconds to 90 seconds.

A manufacturing method of SOI MOS device having a source/body ohmic contact via silicide process is provided in the present invention. The advantages of the present invention are listed as below. The method adopts ion implantation in an inclined direction and the silicide technology, forming a heavily doped P type region under the N-type Si region of the source region and between the silicide and the body region and forming an ohmic contact between the silicide of source region and the heavily doped P type region to release the holes accumulated in body region of the SOI MOS device and eliminate floating body effects thereof Besides, the device of the present invention also has following advantages, such as limited chip area, simplified fabricating process and great compatibility with traditional CMOS technology.

DETAILED DESCRIPTION OF THE EMBODIMENTS

The present invention is further explained in detail according to the accompanying drawings.

First Embodiment

Figure 1A:
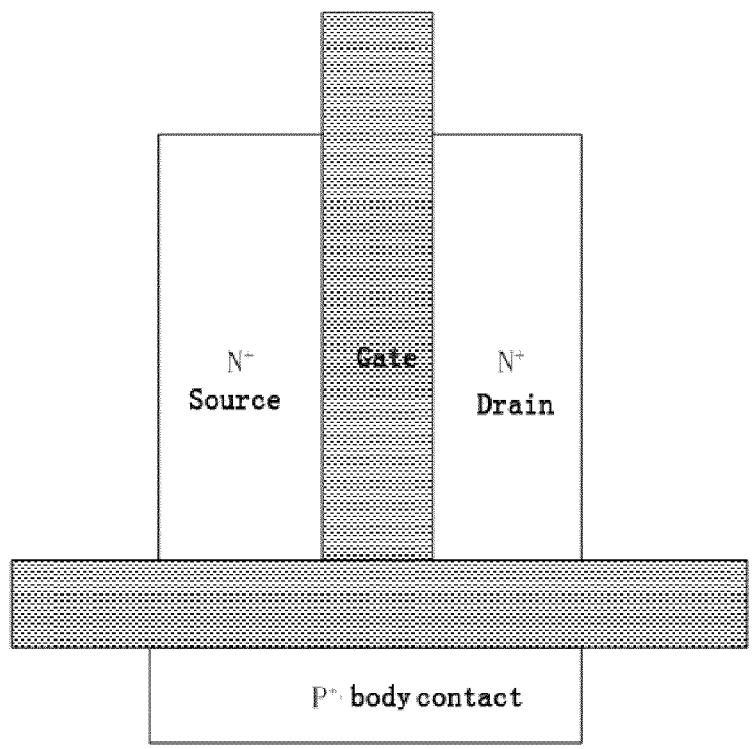
FIG. 1a is a top view of the MOS structure adopting body contact method to eliminate floating body effects in the prior art.
Figure 1B:
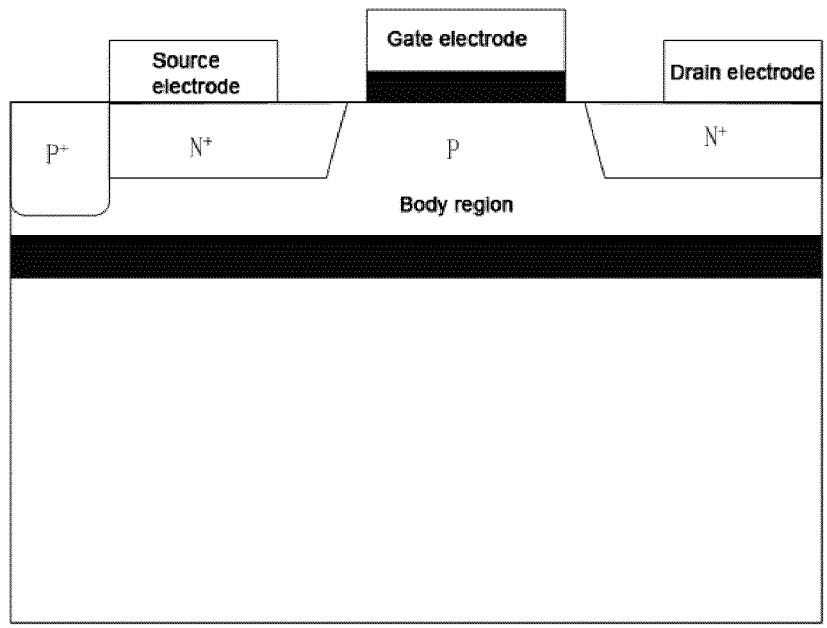
FIG. 1b is a cross sectional view of the MOS structure adopting body contact method to eliminate floating body effects in the prior art.
Figure 2A:
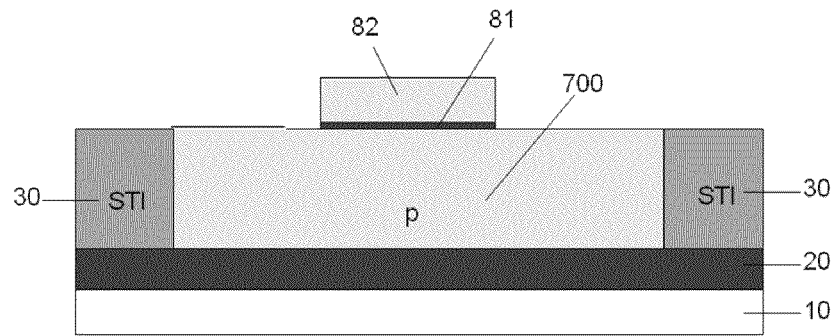
FIG. 2a-2e is the technical flow chart for fabricating MOS device adopting the preparation method of the present invention.
Figure 2B:
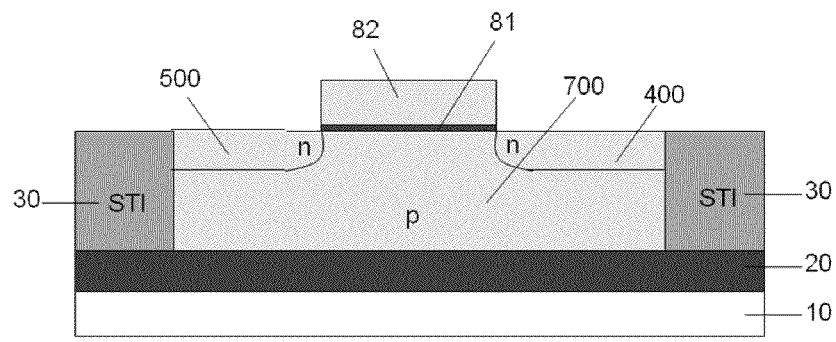
Figure 2C:
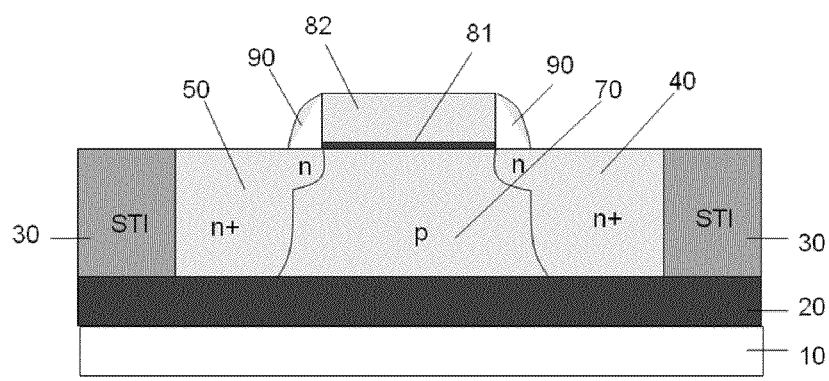
Figure 2D:
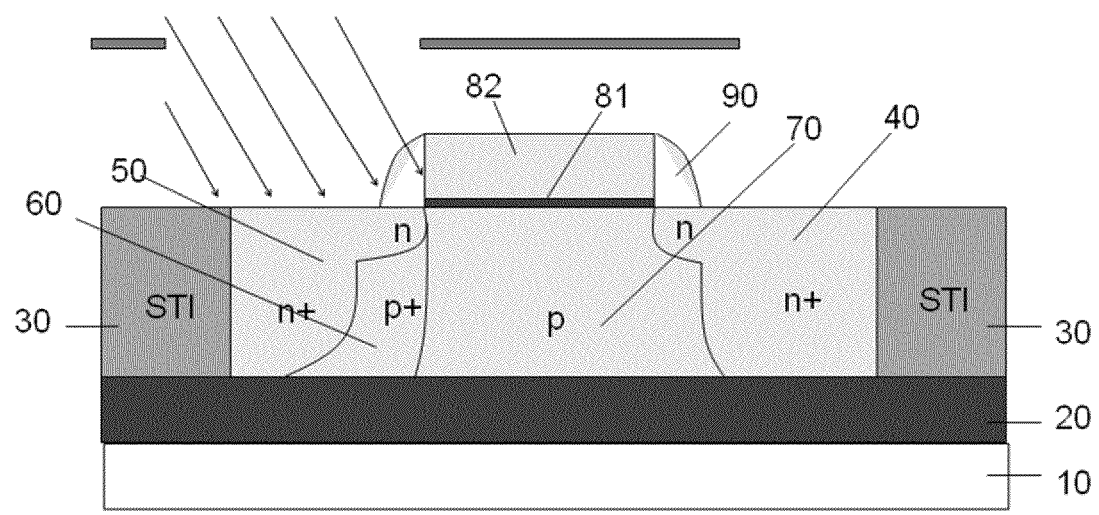
Figure 2E:
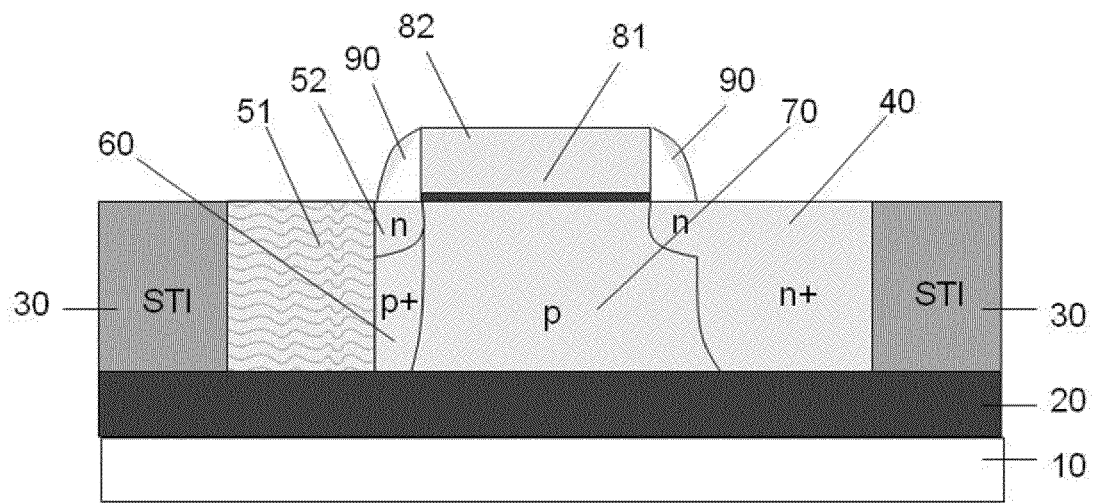

FIG. 2e illustrates a cross sectional view of the MOS device structure eliminating the floating body effects, and the MOS device includes: a Si substrate 10, a buried insulation layer 20 located above the Si substrate 10, an active region located above the buried insulation layer 20, a gate region located above the active region and a shallow trench isolation (STI) structure 30 around the active region.

The active region includes: a body region 70, an N-type source region, an N-type drain region 40 and a heavily-doped P-type region 60; wherein, the N-type source region is composed of a silicide 51 and a N-type Si region 52 which are connected to each other; the N-type source region and the N-type drain region 40 are formed in the opposite two ends of the body region 70; the heavily-doped P-type region 60 is formed under the N-type Si region 52 of the N-type source region, and between the silicide 51 and the body region 70. In addition, the heavily-doped P-type region 60 is surrounded by the silicide 51, the buried insulation layer 20, the body region 70 and the N-type Si region 52, however, the heavily-doped P-type region 60 is not contact with the shallow trench isolation (STI) structure 30.

Wherein, the gate region includes a gate dielectric layer 81 and a gate electrode 82 formed above the gate dielectric layer 81. An insulation spacer 90 is formed surrounding the gate region. The body region is made of Si material. The body region 70 could be made of P-type Si material and the N-type drain region 40 could be made of N-type Si material. The buried insulation layer 20 could be made of the material selected from silicon dioxide or silicon nitride. Consistent with a specific embodiment of the present invention, silicon dioxide is adopted to form a buried oxide layer (BOX). The silicide 51 could be made of any kind of conductive silicides, such as cobalt silicide or titanium silicide, in order to release the holes accumulated in body region of the SOI MOS device and eliminate floating body effects thereof by forming an ohmic contact with the heavily doped P-type region 60 nearby. The Kink effects of SOI PMOS device is not so obvious because the electron-hole pairs produced via collision is much less than SOI NMOS due to the lower ionization rate of the holes. Therefore, the technical solution of the present invention is mainly used in the SOI NMOS devices.

Referring to FIGS. 2a to 2e, the fabrication method of the MOS device structure eliminating SOI floating effects in the present invention includes the flowing steps:

(A) referring to FIG. 2a, form a shallow trench isolation structure 30 on a buried insulation layer 20 on Si substrate (SOI) to isolate an active region 700, create a gate region on the active region, i.e. create a gate dielectric layer 81 and a gate electrode 82 successively above the active region 700; wherein before the gate region is created, P ion implantation is proceeded to the active region to adjust the threshold voltage.

(B) referring to FIG. 2b, proceed high dose source light doping process and drain light doping process respectively; the difference between the method of the present invention and traditional LDD/LDS process is the implantation dosage, for example, the actual implantation dose of the source and drain light doping in the present invention reaches a volume level of 1e15/cm², which could be called as "highly doped source and drain", therefore, both of the lightly doped N type source region 500 and the lightly doped N type drain region 400 have higher doping concentration which could reach a volume level of 1e19/cm³. However, in order to distinguish it from the source and drain implantation, the process in the present invention is still named as "LDD/LDS" which has been adopted in the industry.

(C) referring to FIG. 2c, fabricate an insulation spacer 90 surrounding the gate region adopting material such as silicon dioxide or silicon nitride. The high dose LDD/LDS process in step B ensures the channel current flowing out from the source terminal through N-type LDS, and also ensures lower source and drain resistance. Therefore, there is only once source and drain ion implantation required to form the N-type Si source region 50 and the N-type drain region 40 without the requirement for a second spacer technology to proceed the second source and drain implantation. After this step, a body region 70 is formed between the N-type Si source region 50 and the N-type drain region 40.

(D) referring to FIG. 2d, perform large tilt heavily-doped P ion implantation in an inclined direction via a mask with an opening at the position of the N type Si source region 50, and implant P ions into the space between the N type Si source region 50 and the body region 70 to form a heavily-doped P-type region 60; wherein the angle between a longitudinal line of the N type Si source region 50 and the inclined direction is ranging from 15 to 45 degrees, preferably 35 degrees.

(E) form a metal layer, such as Co layer or Ti layer, on the exposed surface of the N type Si source region 50, then allow the reaction between the metal layer and the remained Si material underneath to form the silicide 51 by heat treatment, and proceed the reaction until the silicide 51 formed being contact with the buried insulation layer 20; the left Si material which has not been react with the metal layer becoming N-type Si region 52; wherein, during the heat treatment, furnace annealing procedure is adopted, and the temperature of heat treatment is between 700° C. and 900° C., preferably 800° C.; and the time of the heat treatment is between 60 seconds to 90 seconds, preferably 80 seconds; the silicide 51 could be cobalt silicide, which is obtained from the reaction between Co and Si; or titanium silicide, which is obtained from the reaction between Ti and Si. A N-type source region is composed of the silicide 51 generated and the N-type Si region 52. The heavily-doped P-type region 60 is contact with the buried insulation layer 20, the body region 70, the N-type Si region of the N-type source region 52 and the silicide 51 respectively, and an ohmic contact formed between the heavily-doped P-type region 60 and the silicide 51. Finally, the fabrication process of the MOS device structure as shown in FIG. 2e is completed.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A manufacturing method of SOI MOS device having a source/body ohmic contact comprising steps of:
   (A) forming a shallow trench isolation structure on a buried insulation layer on Si substrate to isolate an active region and creating a gate region on the active region;
   (B) forming a lightly doped N type source region with high dopant concentration and a lightly doped N type drain region with high dopant concentration via high dose source light doping process and drain light doping process respectively, wherein the dose of the source light doping process and drain light doping process could reach a volume level of 1e15/cm$^2$, and the concentration of the lightly doped N type source region and the lightly doped N type drain region could reach a volume level of 1e19/cm$^3$;
   (C) forming an insulation spacer around the gate region, forming a N type Si source region and a N type drain region via source and drain ion implantation, a body region formed between the N type Si source region and the N type drain region;
   (D) performing large tilt heavily-doped P ion implantation in an inclined direction via a mask with an opening at the position of the N type Si source region and implanting P ions into the space between the N type Si source region and the N type drain region to form a heavily-doped P-type region; wherein the angle between a longitudinal line of the N type Si source region and the inclined direction is ranging from 15 to 45 degrees;
   (E) forming a metal layer on the N type Si source region, then allowing the reaction between the metal layer and the remained Si material underneath to form silicide by heat treatment and proceeding the reaction until the silicide formed being contact with the buried insulation layer; the left Si material which has not been react with the metal layer becoming N-type Si region, and a N-type source region being formed by the silicide and the N-type Si region; the heavily-doped P-type region being contact with the buried insulation layer, the body region, the N-type Si region of the N-type source region and the silicide respectively, and an ohmic contact formed between the heavily-doped P-type region and the silicide.

2. The manufacturing method of SOI MOS device having a source/body ohmic contact in claim 1, wherein in step A, P ion implantation in the active region is performed before creating the gate region.

3. The manufacturing method of SOI MOS device having a source/body ohmic contact in claim 1, wherein in step D, the angle is 35 degrees.

4. The manufacturing method of SOI MOS device having a source/body ohmic contact in claim 1, wherein in step E, the metal layer is formed of the metal selected from Co or Ti.

5. The manufacturing method of SOI MOS device having a source/body ohmic contact in claim 1, wherein in the heat treatment of step E, furnace annealing procedure is adopted.

6. The manufacturing method of SOI MOS device having a source/body ohmic contact in claim 1, wherein in the heat treatment of step E, the temperature of heat treatment is ranging from 700° C. to 900° C. and the time of the heat treatment is ranging from 60 seconds to 90 seconds.

* * * * *